(12) United States Patent
Hwang

(10) Patent No.: US 7,008,830 B2
(45) Date of Patent: Mar. 7, 2006

(54) POLY-CRYSTALLINE THIN FILM TRANSISTOR AND FABRICATION METHOD THEREOF

(75) Inventor: Han-Wook Hwang, Seoul (KR)

(73) Assignee: LG.Philips LCD Co., Ltd., Seoul (KR)

( * ) Notice: Subject to any disclaimer, the term of this patent is extended or adjusted under 35 U.S.C. 154(b) by 19 days.

(21) Appl. No.: 10/733,237

(22) Filed: Dec. 12, 2003

(65) Prior Publication Data
US 2004/0126955 A1    Jul. 1, 2004

Related U.S. Application Data

(62) Division of application No. 10/279,934, filed on Oct. 25, 2002, now Pat. No. 6,713,825.

(30) Foreign Application Priority Data

Dec. 28, 2001   (KR) .................... 10-2001-0087446

(51) Int. Cl.
*H01L 21/00* (2006.01)
*H01L 21/84* (2006.01)

(52) U.S. Cl. .................................... 438/151; 438/154
(58) Field of Classification Search ................ 438/149, 438/289, 151, 154
See application file for complete search history.

(56) References Cited

U.S. PATENT DOCUMENTS 5,648,277 A * 7/1997 Zhang et al. ............... 438/151
5,835,172 A * 11/1998 Yeo et al. .................... 349/46
5,849,611 A * 12/1998 Yamazaki et al. .......... 438/151
5,898,188 A * 4/1999 Koyama et al. .............. 257/75
5,953,598 A * 9/1999 Hata et al. .................. 438/164
6,165,876 A * 12/2000 Yamazaki et al. .......... 438/517
6,197,627 B1 * 3/2001 Kishi .......................... 438/199
6,569,717 B1 * 5/2003 Murade ....................... 438/149
6,788,108 B1 * 9/2004 Miyake et al. ............... 326/88
2005/0051802 A1 * 3/2005 Miyake et al. .............. 257/207

* cited by examiner

*Primary Examiner*—Alexander Ghyka
(74) *Attorney, Agent, or Firm*—McKenna Long & Aldridge LLP

(57) ABSTRACT

A thin film transistor and its fabrication method. The transistor includes a buffer layer on a substrate, and a poly-crystalline semiconductor layer on the buffer layer. The poly-crystalline semiconductor layer includes a channel layer, offset regions along sides of the channel layer, sequential doping regions along sides of the offset regions, and source and drain regions. The doping concentration is sequentially changed in the sequential doping region. A sloped gate insulation layer is on the poly-crystalline semiconductor layer. A gate electrode having a main gate electrode and auxiliary gate electrodes is on the sloped insulation layer. An interlayer is over the gate electrode and source and drain electrodes are formed in contact with the source and drain regions and on the interlayer. The poly-crystalline semiconductor layer is formed by ion doping a poly-crystalline semiconductor layer through the gate insulation layer while using the gate electrode as a mask.

11 Claims, 3 Drawing Sheets

POLY-CRYSTALLINE THIN FILM TRANSISTOR AND FABRICATION METHOD THEREOF

This application is a Divisional of prior U.S. application Ser. No. 10/279,934, filed Oct. 25, 2002 now U.S. Pat No. 6,713,825.

BACKGROUND OF THE INVENTION

1. Field of the Invention

The present invention relates to poly-crystalline thin film transistors and to their fabrication. More particularly, the present invention relates to poly-crystalline thin film transistors having multiple section gate electrodes and multiple section semiconductor layers.

2. Description of the Background Art

Thin film transistors used in active matrix liquid crystal displays are typically made of amorphous silicon (a-Si). Amorphous silicon is advantageous in that it enables large area displays that can be fabricated at low temperature on low-cost glass substrates. However, since the mobility of a-Si thin film transistors is low, such transistors are not well suited for LCD drive applications. In contrast, poly-crystalline silicon thin film transistors have high mobility. This makes them interesting candidates for both LCD array and driving circuits.

FIG. 1 illustrates a poly-crystalline (p-Si) silicon transistor that is suitable for driving a pixel of a liquid crystal display. The transistor in FIG. 1 is a poly-crystalline silicon, CMOS (Complimentary Metal Oxide Semiconductor) thin film transistor that includes a buffer layer 3 on a transparent glass substrate 1. On the buffer layer 3 is a semiconductor layer having a p-Si intrinsic channel layer 4, an LDD region 5 that is doped with an impurity at a low concentration, and source and drain regions 6 that are impurity doped at a high concentration. A gate insulation layer 9 is formed over the substrate 1, and a gate electrode 2 is on the gate insulation layer 9 and over the channel layer 4. An interlayer 13 is deposited over the gate electrode 2 and over the gate insulation layer 9. The interlayer 13 includes via holes that expose the source and drain regions 6. Source and drain electrodes 11 are then formed on the interlayer 13 and in the via holes so as to contact the source and drain regions 6. A passivation layer 15 is then deposited over the interlayer 13 and source and drain electrodes 11, and a drain contact hole is formed through the passivation layer 15. A pixel electrode 17 is then formed on the passivation layer 15 and in the drain contact hole so as to contact the drain electrode 11.

As mentioned above, poly-crystalline silicon has a high mobility. Thus, the switching time of the transistor shown in FIG. 1 is fast, which reduces signal delays. In addition, p-Si driving circuits that use such CMOS thin film transistors can be formed along with pixel driving thin film transistors on the same liquid crystal panel substrate. This simplifies the fabrication processes.

However, poly-crystalline silicon thin film transistors constructed as shown in FIG. 1 tend to have higher leakage currents than amorphous silicon thin film transistor switching devices. High leakage causes the voltage applied to a pixel to drift, which can result in flicker and poor picture quality in a liquid crystal display.

As is well known, leakage current in a poly-crystalline silicon thin film transistor is related to the electric field distribution between the drain and source regions and the gate. While the poly-crystalline silicon thin film transistor illustrated in FIG. 1 reduces leakage current by incorporating the LDD region 5, which reduces the electric field along the sides of the source and drain regions, such poly-crystalline silicon thin film transistors have relatively high parasitic resistances and a relatively low ON-state current.

SUMMARY OF THE INVENTION

Therefore, an object of the present invention is to provide a low current leakage poly-crystalline thin film transistor that has a high ON-state current.

To achieve these and other advantages and in accordance with the purpose of the present invention, as embodied and broadly described herein, there is provided a poly-crystalline thin film transistor having a buffer layer on a substrate, and a poly-crystalline semiconductor layer on the buffer layer. The poly-crystalline semiconductor layer includes a channel layer, offset regions along both sides of the channel layer, and sequential doping regions along sides of the offset regions. The doping concentration of the sequential doping regions sequentially changes. Source and drain regions are formed along sides of the sequential doping regions. A gate insulation layer is on the semiconductor layer. A gate electrode is on the gate insulation layer. The gate electrode includes both a main gate electrode and auxiliary gate electrodes. An interlayer covers the gate electrode. Source and drain electrodes on the interlayer pass through the interlayer to connect to the source and drain regions. Beneficially, the substrate is glass.

To achieve the above objects, there is also provided a poly-crystalline thin film transistor fabrication method that includes forming a poly-crystalline semiconductor layer on a buffer layer on a substrate. A gate insulation layer having downwardly tapered sections over locations where sequentially doped regions are to be is formed over the poly-crystalline semiconductor layer. A metal layer is formed on the gate insulation layer. That metal layer is then patterned to form a gate electrode comprised of a main gate electrode and auxiliary gate electrodes. The semiconductor layer is then impurity doped while using the gate electrode as masks so as to form a channel layer, offset regions, sequential doping regions, and source and drain regions. An interlayer is then deposited and contact holes that expose portions of the source and drain electrodes are formed through the interlayer. Source and drain electrodes are then formed on the interlay such that the source and drain electrodes respectively contact the source and drain regions. Additionally, a passivation layer can be formed over the source and drain electrodes.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Figure 1:
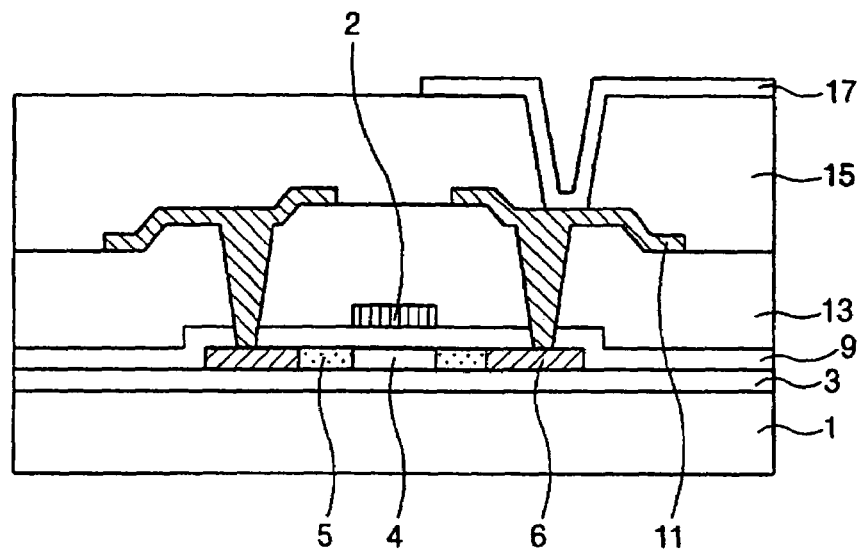
FIG. 1 is a sectional view of a conventional art poly-crystalline silicon thin film transistor.

Reference will now be made in detail to the illustrated embodiments of the present invention, examples of which are shown in the accompanying drawings.

The principles of the present invention provide for poly-crystalline silicon thin film transistors having low leakage current and high ON-state current. Such transistors are adaptable for use in liquid crystal displays. According to the principles of the present invention, such a poly-crystalline silicon thin film transistor includes a gate electrode that is comprised of a main gate electrode and of auxiliary gate electrodes that extend from the main gate. In addition, the transistor includes a poly-crystalline silicon layer comprised of a channel layer below the main gate electrode, offset regions below the auxiliary gate electrodes, sequentially doped regions along sides of the offset regions, and source and drain regions along sides of the sequentially doped regions.

The principles of the present invention provide for poly-crystalline silicon thin film transistors having horizontal electric fields that are reduced by the offset regions and by the sequential doping regions. This restrains leakage current, electric charge injection effects, and the resistance of the active layer, all of which can improve overall performance. In addition, since a sequential doping region interfaces with the drain region, drain activation using a laser is possible.

A poly-crystalline silicon thin film transistor that is in accord with the principles of the present invention will be described with reference to the accompanying drawings. FIG. 2 shows a sectional view of such a poly-crystalline silicon thin film transistor. As shown, that thin film transistor is similar to the thin film transistor shown in FIG. 1. However, functionally significant structural differences include the poly-crystalline silicon semiconductor layer and the gate electrode. Thus, the descriptions that follow will primarily focus on the differences.

As shown, the poly-crystalline silicon semiconductor layer is on a buffer layer 103. The poly-crystalline silicon semiconductor layer includes a channel layer 104, offset regions 108 that extend along sides of the channel layer 104, sequential doping regions 105 that extend along sides of the offset regions 108, and source and drain regions 106 that extend along sides of the sequential doping regions 105.

Also as shown, a gate electrode 102 includes a main gate electrode 102a and auxiliary gate electrodes 102b. The main gate electrode 102 is formed on a gate insulation layer 109 above the channel layer 104, while the auxiliary gate electrodes 102b are formed on the gate insulation layer 109 above the offset regions 108.

The gate insulation layer 109 is beneficially formed from two gate insulation layers. The first has a thickness "a" and extends over the poly-crystalline silicon semiconductor layer. The second has a thickness "b" and extends over the offset regions 108 and over the sequential doping regions 105. The gate insulation layer 109 slopes downward from over the offset regions 108 toward the channel layer 104 and from over the sequential doping regions 105. Accordingly, the gate electrode 102 is formed with a varying distance from the poly-crystalline silicon semiconductor layer. While the gate insulation layer 109 is described as being comprised of two layers, this is not required. One layer could be formed and then etched to produce a similar structure. However, the sloping surfaces where sequential doping regions 105 are to be formed are significant.

Figure 2:
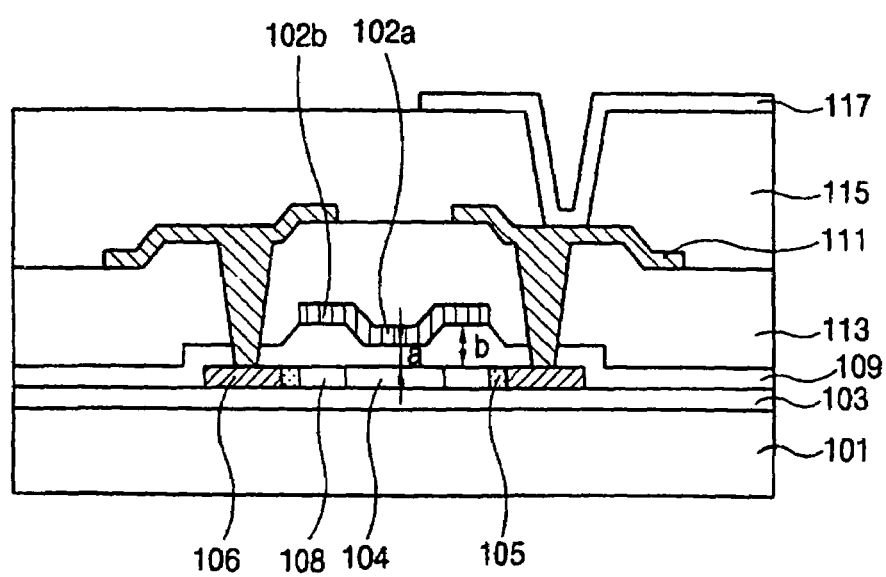
FIG. 2 is a sectional view of a poly-crystalline silicon thin film transistor that is in accord with the principles of the present invention.

The conventional poly-crystalline thin film transistor shown in FIG. 1 includes an intrinsic semiconductor region and LDD regions 5. In contrast, the poly-crystalline silicon thin film transistor shown in FIG. 2 includes a channel layer 104, offset regions 108, sequential doping regions 105, and source and drain regions 106. The channel layer 104 and the offset regions 108 are undoped, while the sequential doping regions 105 have a doping concentration profile that sequentially changes such that the doping concentration is greater near the source and drain regions 106 (having almost the same concentration at the interface) than near the offset regions 108 (where they are only lightly doped).

Leakage current of a poly-crystalline silicon thin film transistor is at least partially a result of a horizontal electric field at the interface of the gate and the drain electrode (and the source electrode). However, in the present invention the offset regions 108 and the sequential doping regions 105 limit the horizontal electric field such that leakage current is restrained. In addition, the auxiliary gate electrodes 102b over the offset regions 108 reduce electric charge injection, and thus the serial resistance in the offset region 108 is reduced and ON current is increased.

Figure 3A:
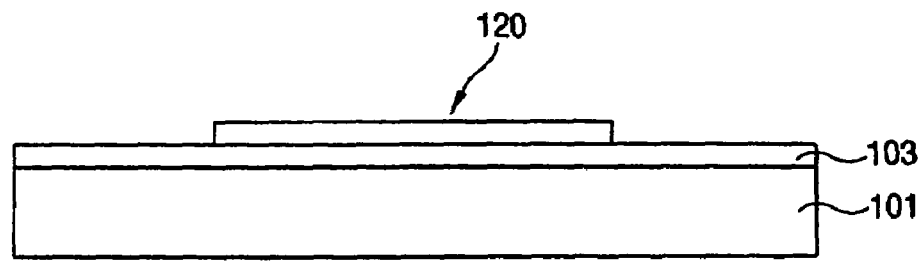
FIGS. 3A through 3E illustrate sequential fabrication of a poly-crystalline silicon thin film transistor that is in accord with the principles of the present invention.

FIGS. 3A–3E illustrate the fabrication of the poly-crystalline silicon thin film transistor shown in FIG. 2. First, as shown in FIG. 3A, a buffer layer 103 is formed on a substrate 101, which is beneficially a glass substrate. Then, a poly-crystalline semiconductor layer 120 is formed on the buffer layer. The poly-crystalline semiconductor layer 120 may be formed by depositing a poly-crystalline semiconductor material directly on the buffer layer 103, or it may be formed by depositing an amorphous semiconductor material and then laser annealing.

Figure 3B:
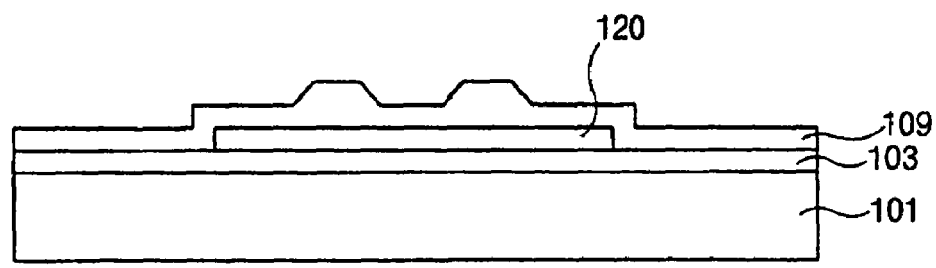

Subsequently, as shown in FIG. 3B, the gate insulation layer 109 is deposited over the substrate 110 and over the poly-crystalline semiconductor layer 120. Though not shown in specific detail, two depositions are used to form the gate insulation layer 109. First, an insulation layer having the thickness "a" is formed. Then, an insulation layer having the thickness "(b-a)" is formed. That second insulation layer is then etched to form the gate insulation layer 109 shown in FIG. 2.

Figure 3C:
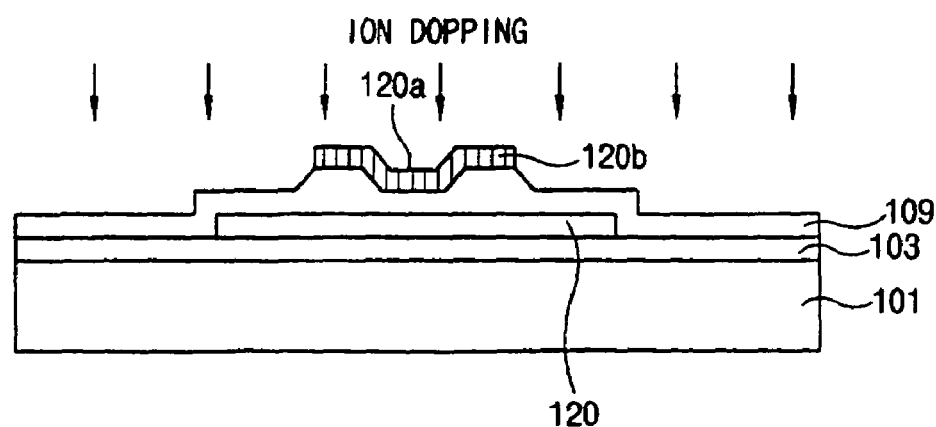
Figure 3D:
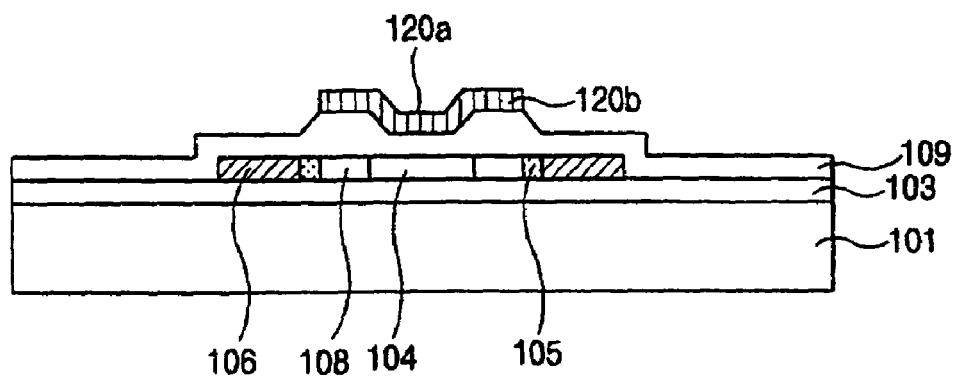

Thereafter, as illustrated in FIG. 3C, a metal layer is formed on the gate insulation layer 109. That metal is etched to form the gate electrode 102, which includes the main gate electrode 102a and the auxiliary gate electrodes 102b. Then, ions are directed toward the semiconductor layer 120. The doping ions are blocked by the gate electrode 102 and partly blocked by the gate insulation layer 109. That is, the exposed gate insulation layer 109 changes the concentration of the ion doping of the semiconductor layer in inverse proportion to the thickness of the gate insulation layer 109. Thus, the sequential doping regions 105 have a doping concentration that varies as the thickness of the gate insulation layer 109 decreases, while the source and drain regions 106 have a constant, high doping concentration. By performing such doping the channel layer 104, the offset regions 108, the sequential doping regions 105, and the source and drain regions 106 are formed as shown in FIG. 3D.

Figure 3E:
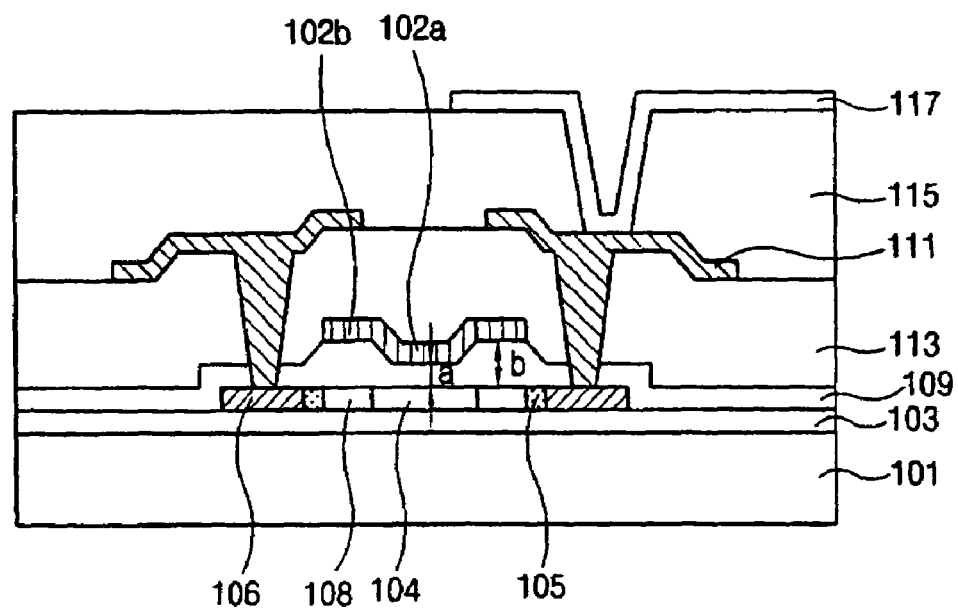

Thereafter, as shown in FIG. 3E, the interlayer 113 is deposited, contact holes are formed, and then source and drain electrodes 111 are formed. Then, a passivation layer 115 having a drain contact hole that exposes the drain electrode 111 is formed. Finally, a pixel electrode 117 that connects to the drain electrode 111 is formed on the passivation layer. This completes the poly-crystalline silicon thin film transistor.

As described above, by forming the offset region, the sequential doping regions, and the special gate electrode, the leakage current of the poly-crystalline silicon thin film transistor is restrained and ON current can be improved.

In addition, since the thickness of the gate insulation layer over the sequential doping region is toward the source/drain region, ion-doping does not damage the interface region of the sequential doping regions and the offset regions. This enables an activation process that uses a laser.

As described above, the present invention is a poly-crystalline silicon thin film transistor in which the leakage current is restrained and a reduction in ON current is prevented. Such a poly-crystalline silicon thin film transistor can be used as an element for a driving device as well as a pixel switching device of a liquid crystal display, and can be integrally formed on a liquid crystal panel.

The poly-crystalline silicon thin film transistor with a specific structure has been described in the present invention, but the present invention is not limited to that specific structure. As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the meets and bounds of the claims, or equivalence of such meets and bounds are therefore intended to be embraced by the appended claims.

What is claimed is:

1. A poly-crystalline thin film transistor fabricating method comprising:
    forming a poly-crystalline semiconductor layer on a buffer layer on a substrate;
    forming a gate insulation layer over the poly-crystalline semiconductor, wherein the gate insulation layer is formed with a first thickness at a channel position and at source and drain positions, wherein the gate insulation layer is formed with a second thickness at offset positions, and wherein the thickness of the gate insulation layer tapers in sequential doping positions from the second thickness to the first thickness;
    forming a gate structure on the gate insulation layer, wherein the gate structure includes a main gate electrode over the channel position and auxiliary gate electrodes over the offset positions;
    impurity doping the semiconductor layer through exposed portions of the gate insulation layer while using the gate structure as a mask to define sequential doping regions that are aligned with the sequential doping positions, and source and drain regions that are aligned with the source and drain positions.

2. The method of claim 1, further including forming an interlayer over the gate insulation layer and over the gate electrode; and
    forming contact holes through the interlayer to expose the source and drain electrodes.

3. The method of claim 2, further including forming drain and source electrodes that contact the source and drain regions through the contact holes.

4. The method of claim 1, wherein forming a poly-crystalline semiconductor layer includes depositing a poly-crystalline silicon on the buffer layer.

5. The method of claim 1, wherein forming a poly-crystalline semiconductor layer includes depositing the buffer layer on a glass substrate.

6. The method of claim 1, wherein forming a poly-crystalline semiconductor layer comprises:
    depositing an amorphous silicon on the buffer layer; and
    laser-annealing the amorphous silicon.

7. The method of claim 1, wherein forming the gate insulation layer comprises:
    forming a first insulation layer on the poly-crystalline semiconductor layer;
    forming a second insulation layer on the first insulation layer; and
    etching the second insulation layer.

8. The method of claim 1, wherein impurity doping the semiconductor layer includes forming an impurity concentration in the sequential doping region that depends on the taper of the gate insulation layer in the sequential doping positions.

9. The method of claim 3, further comprising forming a passivation layer over the source and drain electrodes and over the interlayer.

10. The method of claim 9, further comprising forming a drain contact hole through the passivation layer, wherein the drain contact hole exposes the drain electrode.

11. The method of claim 10, further comprising forming a drain contact electrode on the passivation layer, wherein the drain contact electrode contacts the drain electrode through the drain contact hole.

* * * * *